(12) United States Patent
Henrion et al.

(10) Patent No.: US 7,019,367 B2
(45) Date of Patent: Mar. 28, 2006

(54) INTEGRATED CIRCUIT

(75) Inventors: Carson D. Henrion, Fort Collins, CO (US); Gary L. Taylor, Windsor, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 151 days.

(21) Appl. No.: 10/655,640

(22) Filed: Sep. 5, 2003

(65) Prior Publication Data

US 2005/0051794 A1   Mar. 10, 2005

(51) Int. Cl.
*H01L 23/62* (2006.01)

(52) U.S. Cl. .............. 257/357; 257/173; 257/200; 326/31; 326/68; 365/189.09

(58) Field of Classification Search ........... 257/173, 257/200, 357; 326/31, 68; 365/189.09
See application file for complete search history.

(56) References Cited

U.S. PATENT DOCUMENTS

| | | | |
|---|---|---|---|
| 6,198,136 B1* | 3/2001 | Voldman et al. | 257/357 |
| 6,392,439 B1* | 5/2002 | Tanaka et al. | 326/68 |
| 6,711,071 B1* | 3/2004 | Mizuno et al. | 365/189.09 |
| 2005/0098798 A1* | 5/2005 | Miyazawa et al. | 257/200 |

* cited by examiner

*Primary Examiner*—David Nelms
*Assistant Examiner*—Dao H. Nguyen

(57) ABSTRACT

An integrated circuit is disclosed herein. One embodiment of the integrated circuit comprises a power supply conductor, a circuit, at least one bypass capacitor, and an electrostatic protection circuit. The circuit may be located on a first piece of silicon, which may be located on a first insulator. The bypass capacitor may be located on a second piece of silicon, which may be located on second insulator. The electrostatic protection circuit may be located on a third piece of silicon, which may be located on a third insulator. The electrostatic protection circuit is connected to the power supply conductor by way of a first line. The bypass capacitor and the circuit are connected to the power supply conductor by way of a second line. The resistance of the second line is greater than the resistance of the first line.

17 Claims, 4 Drawing Sheets

US 7,019,367 B2

INTEGRATED CIRCUIT

BACKGROUND

Many electronic circuits, such as processors, have several different devices incorporated therein that are connected together. One device that may be incorporated into a processor is an input/output device, which is sometimes simply referred to as an I/O device. I/O devices serve to input and output data to and from the processor. Many of these I/O devices have power supplies that are separate or isolated from power supplies connected to other devices incorporated into the processor. More specifically, the power supply associated with an I/O device is typically required to be isolated from the resonance of the other power supplies or anomalies may occur in the operation of the I/O device. In addition, the power supply associated with the I/O devices may operate at a different potential than other devices.

The electric circuit typically has bypass capacitors associated with the I/O device. Some bypass capacitors improve edges on digital signals, which improves the operation and speed of the I/O device. The bypass capacitors typically have resistors connected to them in order to form RC filters. Therefore, the bypass capacitors use area on the electronic circuit for both the capacitors and the resistors.

Another device typically incorporated into an electronic circuit is an electrostatic discharge device. The electrostatic discharge device serves to protect the devices, and the electric circuit as a whole, from electrostatic discharge by grounding transient voltages associated with electrostatic discharge. More specifically, current generated by a transient is discharged by the electrostatic discharge device to ground via a low resistance path. Therefore, the transient is discharged without damaging devices within the electric circuit.

A problem of isolating power supplies arises with high speed processors and other high speed electric circuits. A resistance in line between the power supply and the I/O devices serves to isolate the I/O devices from resonance caused by other devices connected to the power supply. However, the resistance counters the effectiveness of the electrostatic discharge device. Therefore, there is a tradeoff between reducing the resonance on the I/O power supply and the effectiveness of the electrostatic discharge device.

Another problem arises by the amount of space required for the resistors associated with the bypass capacitors. There are typically a large number of resistors used with the bypass capacitors, which uses space that could otherwise be used for other devices to improve the operation of the electronic circuit.

SUMMARY

An integrated circuit is disclosed herein. One embodiment of the integrated circuit comprises a power supply conductor, at least one circuit, at least one bypass capacitor, and an electrostatic protection circuit. The circuit may be located on a first piece of silicon, which may be located on a first insulator. The at least one bypass capacitor circuit may be located on a second piece of silicon, which may be located on second insulator. The electrostatic protection circuit may be located on a third piece of silicon, which may be located on a third insulator. The one electrostatic protection circuit is connected to the power supply conductor by way of a first line. The at least one bypass capacitor and the at least one circuit are connected to the power supply conductor by way of a second line. The resistance of the second line is greater than the resistance of the first line.

DESCRIPTION

Figure 1:
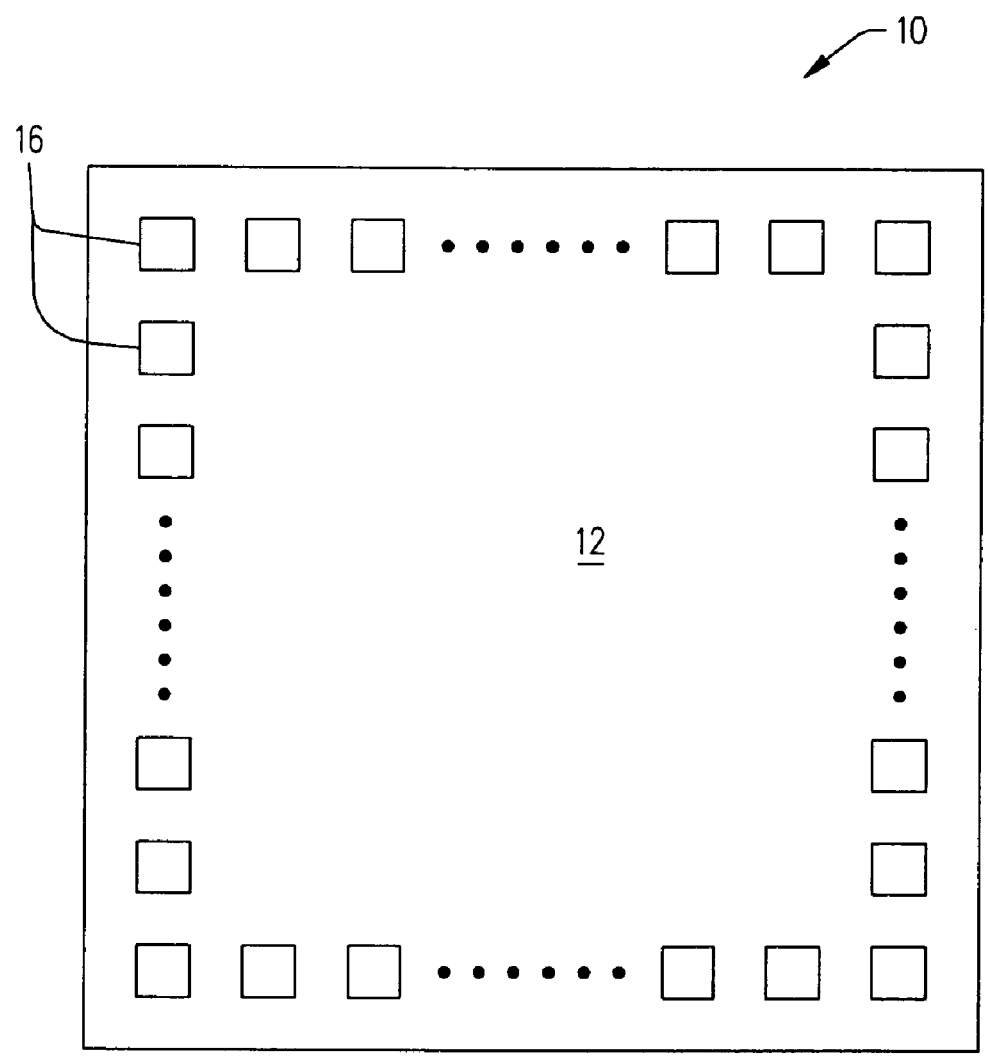
FIG. 1 is an embodiment of an integrated circuit.

An embodiment of an integrated circuit 10 is shown in FIG. 1. The integrated circuit may be, as an example, a central processing unit (CPU) of the type typically used in a computer and is sometimes referred to as a CPU die. In one non-limiting embodiment, the integrated circuit 10 is of the type referred to as silicon on insulator (SOI) integrated circuit. The integrated circuit 10 has a surface 12 onto which a plurality of circuits 16 may be located. It should be noted that the circuits 16 may be formed into a plurality of layers that form the integrated circuit 10. As described in greater detail below, the circuits 16 serve to provide power to various devices, not shown, on the integrated circuit 10 of FIG. 1. In one embodiment, the integrated circuit 10 has approximately thirty-eight circuits 16.

Figure 2:
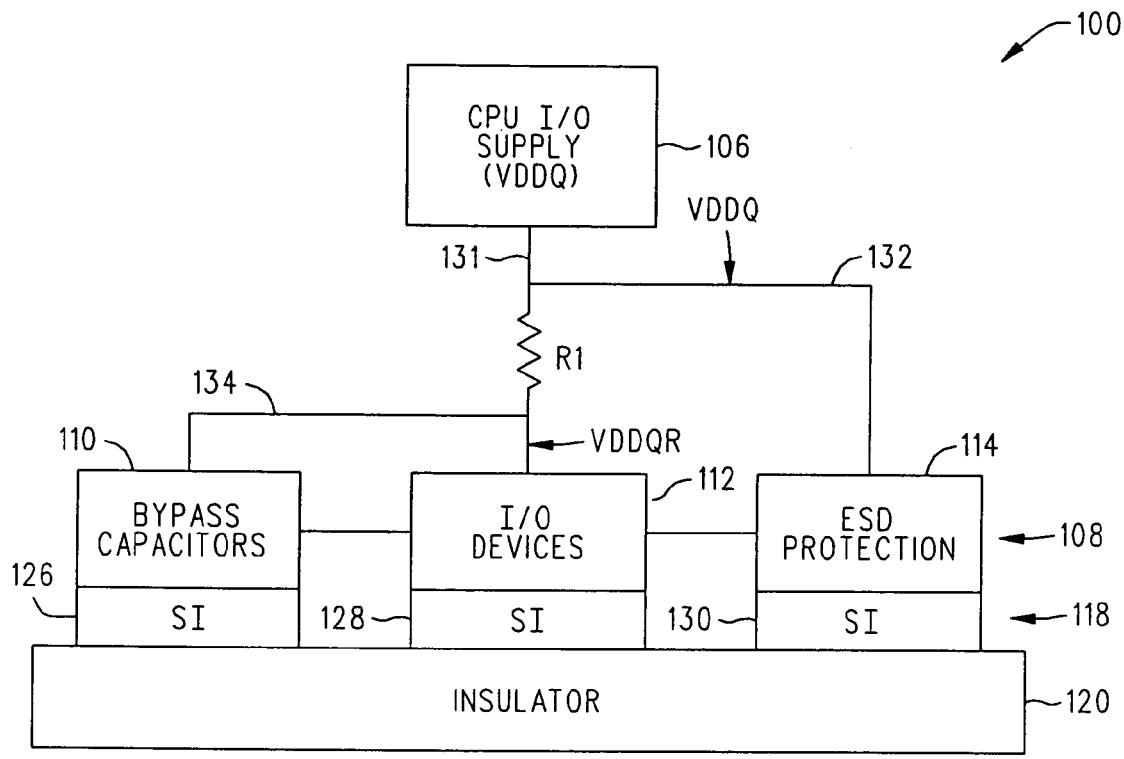
FIG. 2 is an embodiment of a schematic diagram showing the association between a CPU power supply and devices located on the integrated circuit of FIG. 1.

An embodiment of a schematic diagram of one of the circuits 16 of FIG. 1 is shown in FIG. 2 and is referred to as a circuit 100. The circuit 100 includes a power supply conductor 106 that is sometimes referred to as the CPU I/O supply 106. The potential supplied by the CPU I/O supply 106 is referred to as VDDQ. As described in greater detail below, the CPU I/O supply 106 may be a portion of a trace that passes throughout the integrated circuit 10, FIG. 1. The I/O supply 106 may be connected to a power supply, not shown, that is external to the integrated circuit 10, FIG. 1.

The circuit 100 also includes a plurality of devices 108. In the non-limiting embodiment of the circuit 100 described herein, the devices 108 include bypass capacitors 126, input/output (I/O) devices 128, and electrostatic discharge (ESD) protection 114. The devices 108 are located on or etched into separate pieces or portions of silicon 118, which are located on an insulator 120. The pieces of silicon 118 are shown as being on a single insulator 120. However, it should be noted that each piece of silicon may be located on a separate insulator or the insulator 120 may be separated into individual portions. This silicon on insulator circuit formation is consistent with the integrated circuit 10 being an SOI integrated circuit as described above.

The bypass capacitors 110 are etched into a first portion of silicon 126. Unlike conventional integrated circuits, the bypass capacitors 110 associated with the circuit 100 do not need resistors connected to the individual capacitors as described in greater detail below. The I/O devices 112 are etched into a second portion of silicon 128. The ESD protection 114 is etched into a third portion of silicon 130. The circuit 100 has a resistor R1 located or etched therein. As described in greater detail below, the resistor R1 serves to isolate the power supplied to the I/O devices 112 from the power supplied to the ESD protection 114. Although the resistor R1 is shown as a discrete device, it may be buried between the CPU I/O supply 106 and the insulator 120. It should be noted that the use of an SOI devices further serves to electrically isolate the devices 108 from each other.

As briefly described above, the CPU I/O supply 106 serves to conduct power to the devices 108 associated with the circuit 100. The CPU I/O supply 106 may be one or more traces located on one or more layers of the circuit 100. It should be noted that transient voltages, resonance, or other voltage fluctuations on the CPU I/O supply 106 may cause the devices 108 connected to the CPU I/O supply 106 to malfunction or operate inefficiently. For example, resonance on the CPU I/O supply 106 may cause the I/O device to operate improperly or reduce its ability to operate at relatively high speeds. One means of reducing resonance affecting the I/O devices 112 is by way of the resistor R1 as described in greater detail below.

The I/O devices 112 serve as communication mediums for the circuit 100 and the devices 108 associated with the circuit. For example, data transmissions to and from the circuit 100 may be conducted via the I/O devices 112. Accordingly, the I/O devices 112 serves as communication mediums for the integrated circuit 10, FIG. 1, as a whole. As the I/O devices 112 operate at higher speeds or frequencies, they tend to become more sensitive to fluctuations in the their supply voltages. Therefore, their power supplies must be very well regulated when the I/O devices 112 are operating at high frequencies. One method of regulating the power supplies is by isolating the power supplied to the I/O devices 112 from other devices associated with the circuit 100. As disclosed in greater detail below, the circuit 100 provides for isolation of the power supplied to the I/O devices 112 from other power supplies within the circuit 100 and the integrated circuit 10, FIG. 1. This isolation serves to reduce voltage fluctuations, such as resonance, on the power supplies connected to the I/O devices 112.

The bypass capacitors 110 serve to improve the edges of the digital signals generated and received by the I/O devices 112, which improves the operation of the I/O devices at high frequencies. The bypass capacitors also serve to attenuate resonance and other voltage fluctuations that may otherwise affect the I/O devices 112.

Figure 3:
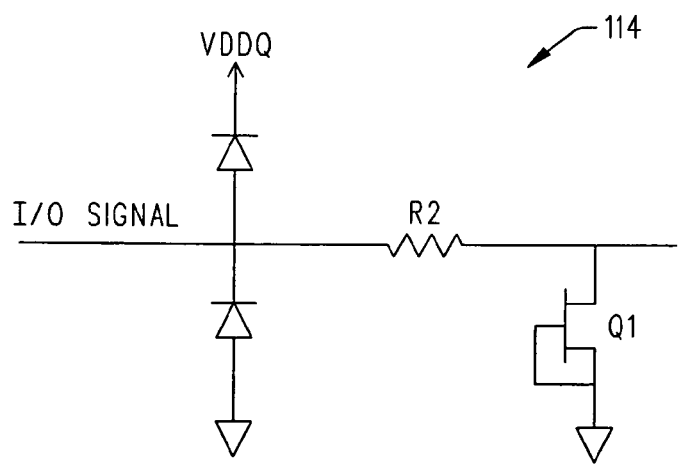
FIG. 3 is a schematic diagram of the electrostatic protection device of FIG. 2

An non-limiting example of the ESD protection 114, FIG. 1, is shown in FIG. 3. As shown, an input/output (I/O) signal line passes through the ESD protection 114. Therefore, ESD protection may be provided for each I/O signal line in the integrated circuit 10, FIG. 1. The ESD protection 114 of FIG. 3 includes two reverse biased diodes, D1 and D2, a series resistor R2, and a transistor Q1. The resistor R2 may have a relatively low resistance. The transistor may be a field effect transistor. As shown in FIG. 3, voltage spikes on the I/O signal line are grounded, which reduces damage to other components of the integrated circuit 10, FIG. 1.

Referring again to FIG. 2, several conductors or lines may be used within the circuit 100 to operatively or otherwise electrically connect the devices within the circuit 100 to each other. The CPU I/O supply 106 may be one of these lines. A line or conductor is any medium that conducts electricity. The lines may be, as an example, conductors doped onto a semiconductor, such as silicon. Although the resistance of the lines may be negligible, the lines may have some resistance associated with them.

A line 131 connects the CPU I/O supply 106 to a first side of the resistor R1. A line 132, which may comprise a plurality of lines, connects the CPU I/O supply 106 to the ESD protection 114. A line 134 connects a second side of the resistor R1 to the bypass capacitors 110 and to the I/O devices 112.

Having described the components of the circuit 100, its operation will now be described.

The CPU I/O supply 106 may be, as an example, a line that connects a power supply, not shown, to several devices connected to the circuit 100. As described above, the power supply may be external to the integrated circuit 10. Because the circuit 100 is based on an SOI process, the devices 108 within the circuit 100 may operate at different potentials, which improves the isolation between the devices 108.

The ESD protection 114 is connected to the CPU I/O supply 106 via the line 132, which has a negligible resistance in order to operate effectively. For example, the resistance of the line 132 may be much less or negligible relative to the resistance of the resistor R1. Many ESD protection devices require a low resistance path from their power supplies in order to operate effectively. The voltage on the line 132 referenced to ground is sometimes referred to as VDDQ.

While the EDS protection 114 is connected to the CPU I/O supply 106 via a low resistance path, the bypass capacitors 110 and the I/O devices 112 are connected to the CPU I/O supply via the resistor R1. The line 134 connects the resistor R1 to the bypass capacitors 110 and the I/O devices 112. The voltage on the line 134 reference to ground is sometimes referred to as VDDQR. The resistor R1 provides dampening for the I/O devices 112 and the bypass capacitors 110, which enables them to operate effectively at high frequencies. More specifically, the resistor R1 dampens resonance on the CPU I/O supply 106 so that its affects on the I/O devices are minimized.

The resistor R1 may be located adjacent the CPU I/O supply 106. In one embodiment, the resistor R1 is located between the CPU I/O supply 106 and the insulator. Such an arrangement of the resistor R1 and is referred to as a buried resistor. This location of the resistor R1 enables the I/O devices 112 to draw current directly from the bypass capacitors 110 without loss due to high resistance between the bypass capacitors 110 and the I/O devices 112. Other circuits have resistors coupled with the bypass capacitors, which results in significant loss between the bypass capacitors 110 and the I/O devices when current is drawn by the I/O devices 112.

The circuit 100 provides for an ESD protection 114 being coupled to a power supply via a low resistance path. In addition, the circuit 100 provides the dampening resistor R1 connected between the CPU I/O supply 106 and the I/O devices 112 and the bypass capacitors 110. The resistor R1 may be a silicon resistive device or a diffusion as used in integrated circuits. The diffusion may be a portion of the line connected between the CPU I/O supply 106 and the bypass capacitors 110 and the I/O devices 112, FIG. 2. The aforementioned circuit description enables the ESD protection 114 to ground electrostatic discharge effectively and the I/O devices 112 are able to be supplied a voltage with minimal resonance and minimal resistance.

Having summarily described the operation of the circuit 100, an embodiment of the layout of the circuit 100 will now be described.

Figure 4:
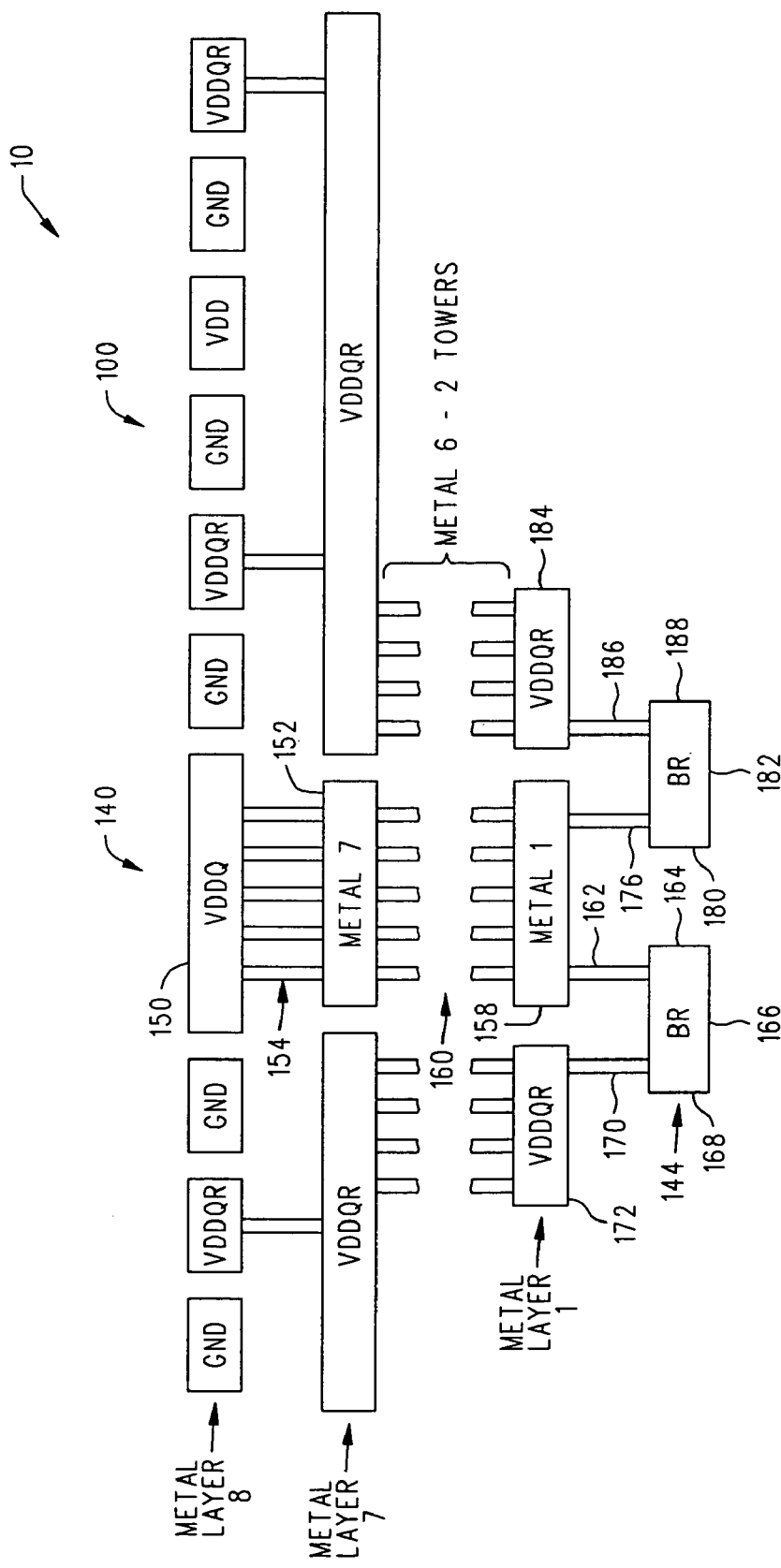
FIG. 4 is an embodiment of a side view of the integrated circuit of FIGS. 1 and 2.

An embodiment of a cutaway side view of a portion of the integrated circuit 10 is shown in FIG. 4. More specifically, FIG. 4 shows an embodiment of the circuit 100. As shown in FIG. 4, the circuit 100 may be comprised of a plurality of conductive layers 140 located between insulating layers that are not shown. The conductive layers 140 may be, as an example, metal layers 140 commonly used in the fabrication of integrated circuits. Each of the layers 140 may have a plurality of traces located thereon, which serve to conduct electricity to various components on the layers 140. The traces of different layers may be connected to one another at preselected locations by way of vias, which conduct electricity through the insulting layers.

In the non-limiting embodiment of the circuit 100 of FIG. 4, the circuit 100 has eight metal layers 140. For illustration purposes, only three metal layers a shown. These metal layers are referenced as metal layer eight, metal layer seven, and metal layer one. In addition, two buried resistors 144 are also shown in FIG. 4. Metal layer eight is sometimes referred to as the top metal layer. Metal layer one is located opposite metal layer eight and is close to or adjacent the insulator 120, FIG. 2.

Metal layer eight has a plurality of traces located on it or etched into it. These traces are lines that provide for, among other purposes, supplying various voltage or power supplies to devices within the circuit 100. These power supplies may include the aforementioned VDDQ and VDDQR. In addition, ground planes or traces may be provided in metal layer eight. A top view of the embodiment of the circuit 100 of FIG. 4 is provided in FIG. 5. It should be noted that metal layer eight, metal layer seven, and metal layer one are all shown in FIG. 5.

Figure 5:
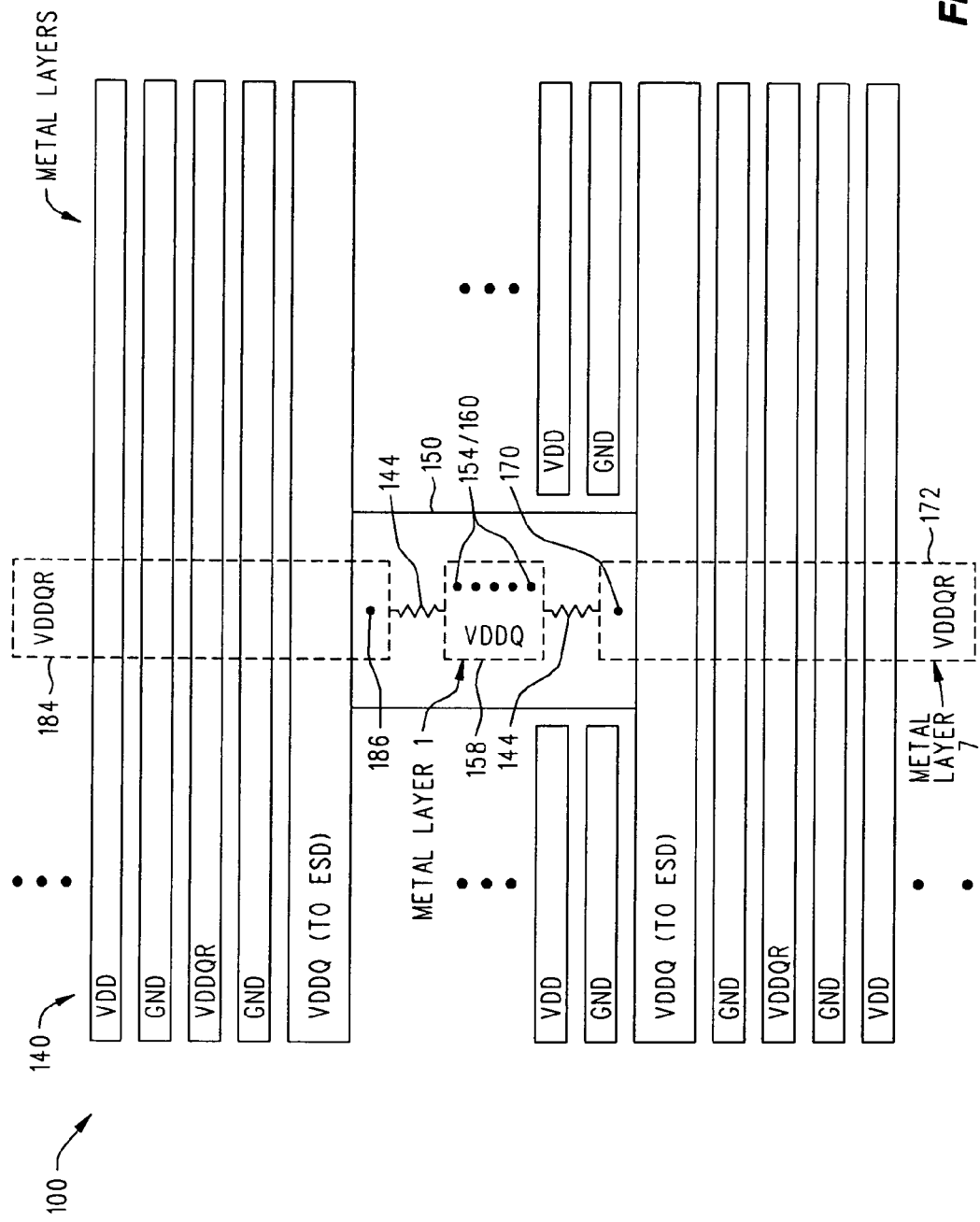
FIG. 5 is a top view of the embodiment of the integrated circuit of FIG. 4.

In the non-limiting embodiment of the circuit 100 shown in FIGS. 4 and 5, the voltage VDDQ is present in metal layer eight on a trace 150. As described above with reference to FIG. 2, the voltage VDDQ supplies the ESD protection 114. In order to generate the voltage VDDQR, the voltage VDDQ is conducted to a trace 152 located on metal layer seven by way of a plurality of vias 154. The voltage VDDQ is also conducted to a trace 158 located on metal layer one by way of a plurality of vias 160. Therefore, the voltage VDDQ is present at the trace 158 on metal layer one. A via 162 conducts the voltage VDDQ to a first end 164 of a first buried resistor 166. The voltage on a second end 168 of the resistor 164 is the voltage VDDQR as described above in reference to FIG. 2. The voltage VDDQR is conducted by way of a via 170 to a trace 172 located on metal layer one. As described above with reference to FIG. 2, the voltage VDDQR supplies power to the I/O devices 112 and the bypass capacitors 108.

FIGS. 4 and 5 show a second buried resistor 182 that may be used to generate the voltage VDDQR. The use of several sources of the voltage VDDQR serves to power several devices from a single voltage VDDQ while maintaining isolation between the voltage supplies to the devices. In the example shown in FIGS. 4 and 5, a via 176 conducts the voltage VDDQ to a first end 180 of the second buried resistor 182. The voltage VDDQR is present on a second end 188 of the second buried resistor 182 and is conducted to a trace 184 located on metal layer one by way of a via 186. The use of the second buried resistor 182 serves to reduce the current density in the buried resistors 144. It should be noted that the voltages VDDQR from the circuits 16 of FIG. 1 may all be connected together.

A top view of the embodiment of the circuit 100 of FIG. 4 is shown in FIG. 5. As shown in FIG. 5, the trace 158 may serve to conduct the voltage VDDQ to various areas on metal layer eight. As shown in FIGS. 4 and 5, the buried resistors 144 are located beneath the metal layers 140, which places them adjacent the insulator 120, FIG. 2. This location of the buried resistors 144 reduces the space occupied on the circuit 100 by keeping the dampening resistors off the metal layers 140. Thus, other components that improve the capabilities of the circuit 100 and the integrated circuit 10, FIG. 1, may be locate on the metal layers. As described in greater detail below, the use of the buried resistors 144 in the SOI device serves to reduce the number of resistors used with the bypass capacitors 110, which also increases the space available for other components.

Having described the layout of an embodiment of the circuit 100, the operation of the circuit 100 will be described in greater detail.

As briefly described above, the voltage VDDQ is supplied to the circuit 100. This may be accomplished by way of an external power source, not shown. It should be noted that the voltage VDDQ may be used to operate devices on the circuit 100 other than those described herein. Although the voltage VDDQ is shown to be conducted on traces on metal layer eight, it should be understood that the voltage VDDQ may conducted on other metal layers 140 within the circuit 100.

As set forth above the ESD protection 114, possibly along with other devices, receive power from the voltage VDDQ. The voltage VDDQ is conducted through the buried resistors 144, which results in the voltage VDDQR. In the embodiment of the circuit described with reference to FIGS. 4 and 5, the voltage VDDQ is conducted to metal layer one where the voltage VDDQ is then conducted to the buried resistors 144. The result is the voltage VDDQR, which is used to power the I/O devices 112 as described above.

With additional reference to FIG. 2, the buried resistors 144 serve as dampening resistors for the bypass capacitors 110. It should be noted that in conventional designs, each capacitor or group of capacitors had a separate resistor associated with it. Because these capacitors and their associated resistors are effectively connected in parallel, the resistance of the resistors has to be relatively large. The use of the SOI process, on the other hand, enables a single resistor R1 to be associated with a large group of bypass capacitors 110. Therefore, the resistance of the resistor R1 may be relatively low.

One other advantage to locating the resistors 144 close to the metal layer one is that the I/O devices 112 may draw current directly from the bypass capacitors 110 without undergoing a voltage drop due resistance associated with each bypass capacitor. The reduced resistance associated with each capacitor of the bypass capacitors 110 further serves to increase the speed at which charges are shared between the capacitors.

What is claimed is:

1. An integrated circuit comprising:
    a power supply conductor;
    at least one circuit located on a first piece of silicon, said first piece of silicon located on a first insulator;
    at least one bypass capacitor circuit located on a second piece of silicon, said second piece of silicon located on a second insulator; and
    at least one electrostatic protection circuit located on a third piece of silicon, said third piece of silicon located on a third insulator;
    said at least one electrostatic protection circuit connected to said power supply conductor by way of a first line; and
    said at least one bypass capacitor circuit and said at least one circuit being connected to said power supply conductor by way of a second line, the resistance of said second line being greater than the resistance of said first line.

2. The circuit of claim 1, wherein said at least one circuit is an input/output device.

3. The circuit of claim 1, wherein said second line is located between said power supply conductor and said first insulator.

4. The circuit of claim 1, wherein at least one portion of said second line comprises a diffusion.

5. The circuit of claim 1, wherein at least one portion of said second line is adjacent said first insulator.

6. The circuit of claim 1, wherein at least a portion of said second line comprises a resistor.

7. The circuit of claim 6, wherein said resistor is adjacent said first insulator.

8. The circuit of claim 1, wherein said second line comprises a plurality of resistors connected in parallel to one another.

9. An integrated circuit comprising:
a power supply conductor;
an input/output circuit located on a first piece of silicon, said first piece of silicon located on a first insulator;
at least one bypass capacitor circuit located on a second piece of silicon, said second piece of silicon located on a second insulator; and
at least one electrostatic protection circuit located on a third piece of silicon, said third piece of silicon located on a third insulator;
said at least one electrostatic protection circuit connected to said power supply conductor by way of a first line; and
said at least one bypass capacitor circuit and said unput/output circuit being connected to said power supply conductor by way of a second line, said second line comprising a plurality of resistors, wherein the resistance of said second line is greater than the resistance of said first line.

10. An integrated circuit comprising:
a power supply means;
at least one circuit located on a first piece of silicon, said first piece of silicon located on a first insulator;
at least one bypass capacitor circuit located on a second piece of silicon, said second piece of silicon located on a second insulator; and
at least one electrostatic protection means located on a third piece of silicon, said third piece of silicon located on a third insulator;
said at least one electrostatic protection means connected to said power supply means by way of a first conducting means; and
said at least one bypass capacitor circuit and said at least one circuit being connected to said power supply conductor by way of a second conducting means, the resistance of said second conducting means being greater than the resistance of said first conducting means.

11. The circuit of claim 10, wherein said at least one circuit is an input/output device.

12. The circuit of claim 10, wherein at least a portion of said second conductive means is located between said power supply means and said first insulator.

13. The circuit of claim 10, wherein at least one portion of said second conductive means comprises a diffusion.

14. The circuit of claim 10, wherein at least one portion of said second conductive means is adjacent said first insulator.

15. The circuit of claim 10, wherein at least a portion of said second conductive means comprises a resistor.

16. The circuit of claim 15, wherein said resistor is adjacent said first insulator.

17. The circuit of claim 10, wherein said second conductive means comprises a plurality of resistors connected in parallel to one another.

* * * * *

UNITED STATES PATENT AND TRADEMARK OFFICE
CERTIFICATE OF CORRECTION

| | | |
|---|---|---|
| PATENT NO. | : 7,019,367 B2 | Page 1 of 1 |
| APPLICATION NO. | : 10/655640 | |
| DATED | : March 28, 2006 | |
| INVENTOR(S) | : Carson D. Henrion et al. | |

It is certified that error appears in the above-identified patent and that said Letters Patent is hereby corrected as shown below:

In column 7, line 25, in Claim 9, delete "unput/" and insert -- input/ --, therefor.

Signed and Sealed this

Twenty-fourth Day of March, 2009

JOHN DOLL
*Acting Director of the United States Patent and Trademark Office*